United States Patent

Hayakawa et al.

[11] 4,126,051
[45] Nov. 21, 1978

[54] CHANNEL SELECTOR

[75] Inventors: Toshio Hayakawa, Katano; Itaru Mitsugi, Kadoma, both of Japan

[73] Assignee: Matsushita Electric Industrial Co., Ltd., Kadoma, Japan

[21] Appl. No.: 701,965

[22] Filed: Jul. 1, 1976

[30] Foreign Application Priority Data

Jul. 23, 1975 [JP] Japan .................................. 50-90506
Jul. 23, 1975 [JP] Japan .................................. 50-90507

[51] Int. Cl.² ............................................. F16H 35/18
[52] U.S. Cl. ...................................... 74/10.41; 334/51; 74/10.15; 74/10.2; 74/10.6
[58] Field of Search .................... 74/10.15, 10.2, 10.41, 74/10.6, 530; 334/51, 84

[56] References Cited

U.S. PATENT DOCUMENTS

| Re. 26,777 | 1/1970 | Fulton | 334/51 |
|---|---|---|---|
| Re. 28,632 | 11/1975 | Badger | 334/51 |
| 941,925 | 11/1909 | James | 74/801 |
| 3,148,345 | 9/1964 | Moran | 334/51 |
| 3,205,720 | 9/1965 | Smith | 334/51 |
| 3,248,674 | 4/1966 | Fulton | 334/51 |
| 3,459,055 | 8/1969 | Sperber | 74/10.6 |
| 3,474,362 | 10/1969 | Harten | 334/51 |
| 3,760,640 | 9/1973 | Mayer | 74/10.6 |
| 3,783,698 | 1/1974 | Ogasawara | 74/10.6 |
| 3,972,240 | 8/1976 | Valdettaro | 74/10.41 |
| 3,973,229 | 8/1976 | Weigel | 74/10.41 |
| 3,990,315 | 11/1976 | Weigel | 74/10.6 |

*Primary Examiner*—Benjamin W. Wyche
*Assistant Examiner*—R. C. Turner
*Attorney, Agent, or Firm*—Cushman, Darby & Cushman

[57] ABSTRACT

This invention relates to a channel selector suitable for use in a television receiver set. The channel selector comprises a channel selecting shaft which is linked to a variable capacitor shaft through an Oldham coupler. A fine tuning shaft also is linked to the variable capacitor shaft through a coupler incorporating an incremental detent arrangement.

Selection of a channel is made by turning the channel selection shaft to move the variable capacitor shaft by a suitable angle (for instance, about 2°). When the channel selection shaft is turned by such an amount, the coupler slips so as to allow the variable capacitor shaft to turn independently of the fine tuning means. Once a channel is selected, fine tuning is made by slightly turning (for instance, within 0.3°) the fine tuning shaft to correspondingly rotate the shaft of the variable capacitor.

The channel selector also comprises means for memorizing the results of the fine adjustments for individual channels. The memory means includes several memory cams, each of which memorizes result of adjustment for several neighboring channels. By so designing the arrangement that each of the memory cams serves to memorize the fine tunings commonly for several channels, the memory means can be made compact and simple.

9 Claims, 7 Drawing Figures

CHANNEL SELECTOR

BACKGROUND OF THE INVENTION

This invention relates to a channel selector, and particularly a UHF channel selector suitable for use in a television receiver.

In conventional channel selectors for a UHF television receiver wherein the channel selector has about 70 channels to select, a channel selector shaft employs a click-stop mechanism for stopping a variable capacitor shaft at a roughly tuned position and a fine tuning means is manipulated each time a desired channel has been selected. Therefore, with known arrangements channel selection is time consuming and requires a certain degree of skill for accurate tuning.

Since a UHF channel selector must cover so many channels, the use of a conventional channel selector having an auxiliary variable capacitor for memorizing fine tuning for each channel, would result in the size of the channel selector being extremely large.

SUMMARY OF THE INVENTION

This invention relates to a channel selector. More particularly, it concerns a UHF channel selector suitable for use in a television receiver.

This invention provides a compact channel selector for a television receiver having a click-stop channel selector shaft and a fine tuning shaft which are linked to a common variable capacitor shaft through an Oldham coupler and through a slippable coupler, respectively. The selector has memory means capable of memorizing results of fine tunings thereby presetting all channels concerned, so that channel selection can be made very quickly without any skill or dexterity being required.

DETAILED DESCRIPTION OF THE INVENTION

Figure 1:
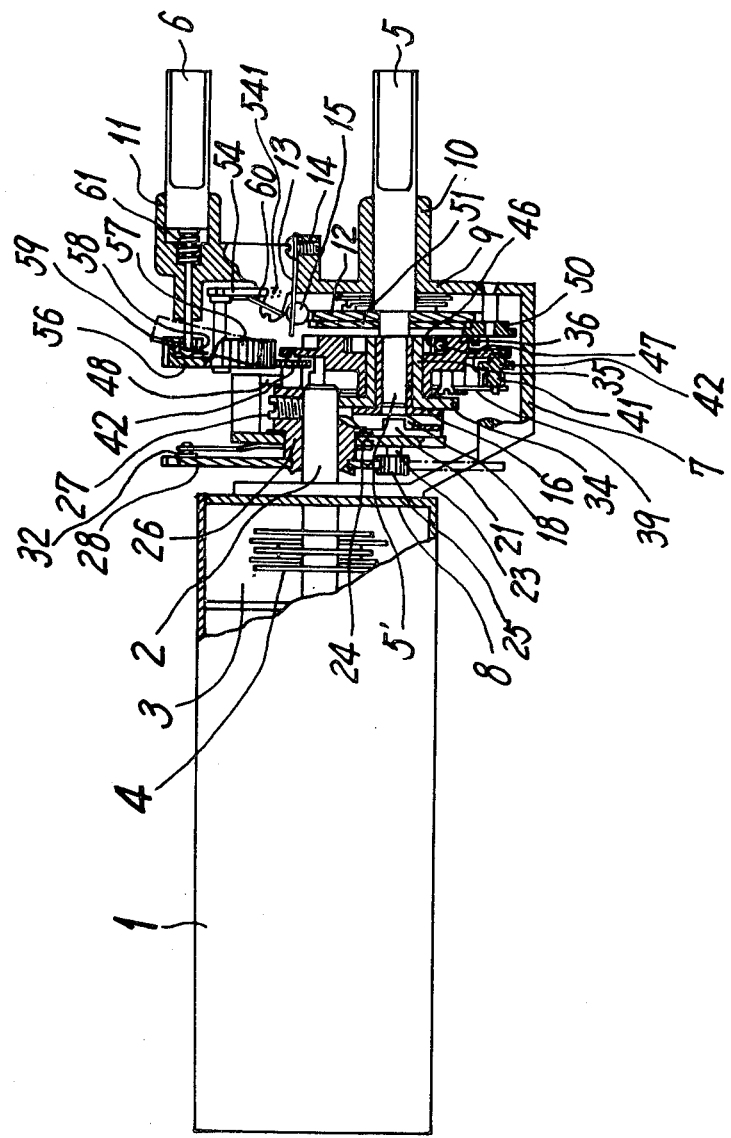
FIG. 1 is fragmented side elevational view, partially in section, of a channel selector according to the present invention.

As shown in FIG. 1, the channel selector comprises a known variable capacitor 3 in a tuner case 1. The variable capacitor 3 has a shaft 2 for turning its rotor to vary the tuned frequency in response to its angular position. Front part 9 of a frame 7 fixed to the tuner case 1 is shaped to form a bearing 10 for a channel selecting shaft 5 and another bearing 11 for a fine tuning shaft 6. A coil spring 61 is provided in the bearing 11 for receiving the tuning shaft 6 in a manner such that the shaft 6 can be pushed in against the resilient force of the spring 61. A cam disc 12 having a number of detents around its periphery is secured to the channel selecting shaft 5. A ball 15 carried at one end of a leaf spring 13 is urged towards the detents, spring 13 being fixed at its other end to the frame 7, by a screw fastener 14. The spring-loaded ball 15 provides click-stops at each angular position of shaft corresponding to a different channel. A driving disc 16 of an Oldham coupler is secured to an end portion 5' of the channel selecting shaft 5, and a small gear 25 for driving a larger gear 28 is secured to a driven disc 21 of the Oldham coupler. As shown the driving disc 16 and the driven disc 21 are rotatably linked to each other when detents 17 diametrically positioned on the driving disc and detents 22 diametrically positioned on the driven disc 21 are located in respective indentations 19 and 20, which are provided on opposite faces of the intermediate disc 18. The indentations are diametrically positioned on disc 18 along diameters extending at right angles to one another. When the discs are linked as just described, rotation of the driving disc 16 is conveyed to the driven disc 21. The shaft 23 of the small gear 25 is journaled in a lever plate 24 which in turn is journaled for rotation about a cylinder 26. By means of the Oldham coupler, the rotation of the channel selecting shaft 5 can be smoothly conveyed to the small gear 25 even when the lever plate 24 is slightly moved around the cylinder 26 hence making the channel selecting shaft 5 and small gear shaft 23 non-coaxial.

Figure 5:
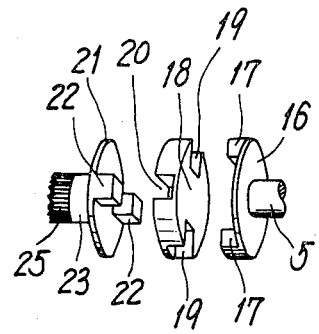
FIG. 5 is an exploded perspective view of one example of an Oldham coupler suitable for use with the present invention.
Figure 6:
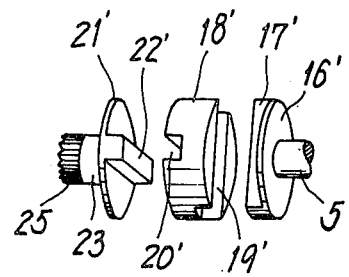
FIG. 6 is an exploded perspective view of another example of an Oldham coupler suitable for use with the present invention.

In the known Oldham coupler shown in FIG. 6, diametrically arranged detents 17' and 22' of driving disc 16' and driven disc 21', respectively, and diametrically arranged indentations 19' and 20' of intermediate disc 18' are continuous across the diameters of the discs. However, the Oldham coupler shown in FIGS. 3 and 5 which has the detents and indentations omitted at the central parts of the discs is preferable. Since shifts between the axes of the driving disc 16 and the driven disc 21 are very small, the omission of the central parts of the detents and indentations presents operability difficulties. Therefore, the omission of the central parts of the indentations allows the intermediate disc 18 to be made thin, hence making the Oldham coupler more compact.

The aforementioned cylinder 26 is fixed about shaft 2 of the variable capacitor 3, and the large gear 28 is fixed to the cylinder 26.

Figure 2:
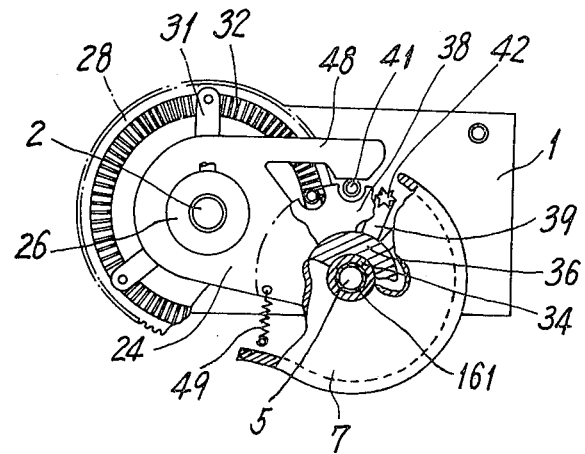
FIG. 2 is fragmented front view, partially in section, of parts of a portion of the FIG. 1 arrangement relating to a spring-notched coupler and fine tuning mechanism.
Figure 3:
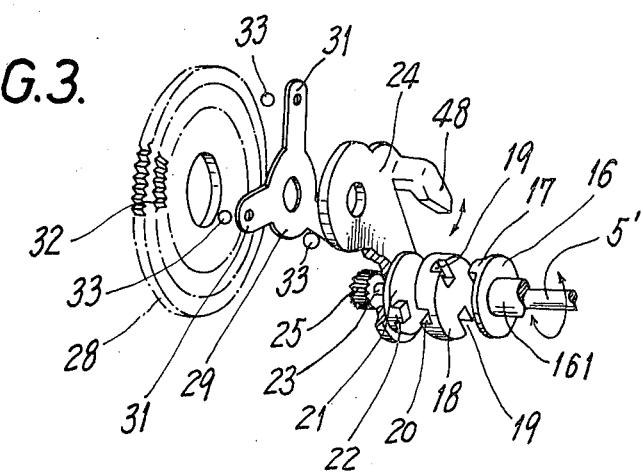
FIG. 3 is an exploded perspective view of portions of the spring-notched coupler shown in FIG. 2 and an Oldham coupler.

As shown in FIGS. 1 to 3, the large gear 28 has a ring of notches 32 disposed on a front face thereof and three balls 33 are pressed against this face by three leaves 31 of a spring plate 29 which is fixed to the aforementioned lever plate 24. Thus, the ring of notches 32, balls 33 and the spring plate 29 form a coupler having an incremental detent arrangement. The pitch of the notches around the shaft 2 is, for instance, about 2°, so that the variable capacitor has click-stops with 2° pitches, and about 70 click stopping positions of the variable capacitor for 70 UHF channels are provided. Since the lever plate 24 is designed to turn within a small angle, for instance, 0.3°, and inasmuch as the spring plate 29 is fixed to the lever plate, the coupler slips when the large gear 28 is turned 2° or more through the action of the small gear 25 resulting from actuation of the channel selecting shaft 5. However, the coupler does not slip when the large gear 28 is turned by a small angle due to turning of the lever plate 24. Therefore, when the lever plate 24 is rotated slightly (for instance, 0.3°) with respect to the cylinder 26 in the manner hereinafter to be described, through the agency of the ring of notches 32, the large gear 28, and shaft 2 of the variable capacitor 3 are slightly turned.

Figure 4:
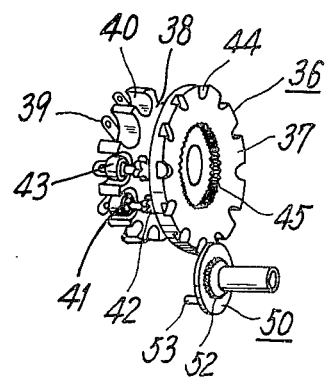
FIG. 4 is a perspective view of the fine tuning mechanism illustrated in FIG. 1.

As shown in FIGS. 1 and 4, a memory drum 36 is rotatably journaled about a sleeve 34 which is fixed to a part of the tuner case 1. The memory drum 36 comprises a core 38 and front disc 37, the latter having several indentations 44 for receiving a pin 53 of a driving gear 50 of a Geneva gear arrangement. The front disc 37 works as a driven gear of the Geneva gear arrangement. Gear 50 is fixed to a small gear 52 which cooperates with a larger gear 51 secured to the channel selecting shaft 5. The front disc 37 also has a ring of detents 45 to which a ball 47 is pressed by a spring 46 to give the memory drum a click stop action. The memory drum 36 also comprises, in indentations 40 of the core 38, a suitable number of memory cams 41 having shafts which are supported between spring plates 39 and bearing pivots (not shown) provided on the rear face of the front disc 37. More particularly, each memory cam 41 is a small cylinder provided with an eccentric shaft, an outer ring 43 which can smoothly rotate around the memory cam and a small gear 42 disposed coaxially with the memory cam shaft.

As shown in FIG. 2, the outer face of one of the outer rings 43 touches the lever 48 of the lever plate 24. A coil spring 49 is provided to provide appropriate touching pressure to the lever 48.

By turning the channel selecting shaft 5, the variable capacitor 3 is rotated as described above, and at the same time, the gear 51 is turned thereby driving the Geneva gear means. The gear ratio of the gears 50 and 51 is selected in a manner such that when the variable capacitor 3 is rotated by six channels, the memory drum 36 advances by one pitch, i.e., from a position where one memory cam 41 touches the lever 48 to a position where the next memory cam 41 touches the lever 48.

As shown in FIG. 1, a substrate 54 pivotally movable to the right by a combination of a shaft 541 and a spring 60 is provided, and a gear 56 having outside teeth 57 and inside teeth 59 is rotatably mounted on the substrate 54. The outside teeth 57 engage one of the small gears 42 associated with a memory cam 41, and the inside teeth 59 engages a small gear 58 at the extended left tip of the fine tuning shaft 6, so that a memory cam 41 is rotated when the fine tuning shaft 6 is turned while it is held in its leftward pressed position against the force of spring 6. When the fine tuning shaft 6 is returned to the rightward restored position by the spring 61, then the gear 56 pivots under the influence of spring 60 so that it is tilted upwards thereby disengaging gear 56 from the small gear 42. During rotation of the memory cam 41, the outer surface of the ring 43 is displaced due to the eccentric relationship of the cam shaft, and therefore, the lever 48 is displaced at its point of contact with the cam. As a result, the lever plate 24 is slightly turned which accordingly through turning of the spring plate 29 and the gear 28 whereby the rotor 4 of the variable capacitor 3 is slightly turned. Thus, fine tuning for the selected channel is achieved.

Figure 7:
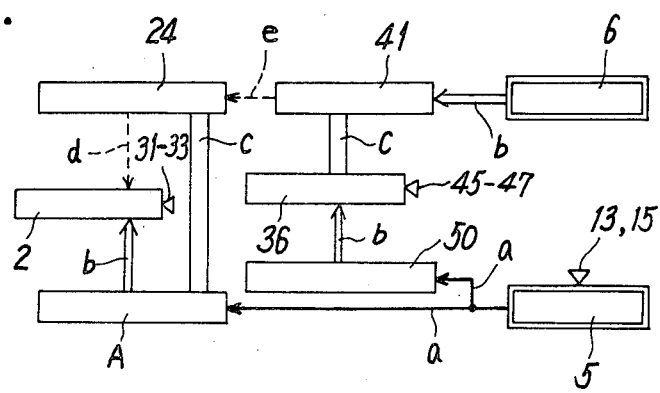
FIG. 7 is a diagrammatic illustration of the linkage employed in the channel selector of the present invention.

In FIG. 7, which is a diagram showing the mechanical linkage relations employed in the abovementioned examples, the corresponding parts are indicated by the same reference numerals as employed in the other figures. In the FIG. 7 diagram, marks utilized are as follows:

▽ — detent and pressed ball(s) for click-stop action,

A — the Oldham coupler,
a — transmission through shaft(s)
b — transmission through gear engagement,
c — transmission through fixed (secured) relation,
d — transmission through notches (32) and spring (29) linkage (slippable detent),
e — transmission through contacting (of lever on the cam).

As shown in FIG. 7, a channel selecting, namely rotation of the variable capacitor shaft 2 for angles of 2° or more are made through shaft couplings, the Oldham coupler and the gear coupling. The slippable detent coupling is overcome by the channel selecting motion, since the channel selecting couplings are stronger than the detent coupling. Fine tuning, namely rotation of the variable capacitor shaft 2 by a small angle (of about 0.3°) is made through gear couplings, contacting and friction (notches and pressed ball). Such fine adjusting of angle can be made within the small play available in the Oldham coupler and in the gears.

In the present channel selector, an important feature that results is that fine tunings for several neighboring channels are memorized in one common memory cam 41. In other words, one memory cam memorizes and gives fine tuning for neighboring several channels. Therefore, there is no need of providing the memory cams 41 the same number of channels covered by the tuner. The common use of one memory element for several neighboring channels has been empirically tested and found usable. The frequencies of neighboring channels are close to one another, and accordingly, the relation between the differences of angle of the variable capacitor 3 and differences of the tuned frequencies is linear for the narrow frequency region of the several neighboring channels. Therefore, once the variable capacitor 3 is finely tuned for one of the channels, a similar relation is given in neighboring channels provided that the tuning circuit is designed to give appropriate frequency differences corresponding to channel frequency differences for each advance to neighboring click stop position of the variable capacitor 3.

By providing, for instance, 12 memory cams 41, each covering six neighboring channels, it is possible to preset the tuner for up to 72 channels. Such a capability is sufficient for a UHF television receiver.

In the present invention, by utilizing an Oldham coupler in the combining of a channel selection motion system with a fine tuning motion system, the structure of the tuner becomes simple and compact.

By employing a common memory cam 41 for several channels, the memory means can be made compact. Also by arranging the memory drum 36 coaxially about the channel selection shaft, the tuner can be made further reduced in size.

By providing notches 32 on the gear disc 28 which is directly fixed to the shaft 2 of the variable capacitor 3, click stop positions of the variable capacitor become precise thereby ensuring reliable tuning for every selection.

By utilizing an improved Oldham coupler with the control parts of its detents and indentations omitted, its intermediate disc 18 can be made thin thereby making the Oldham coupler more compact.

By providing rings 43 rotatable about the memory cams 41 in an easy manner, undesirable friction between the lever 48 and the memory cams 41 is eliminated.

What is claimed is:

1. A channel selector comprising:
a channel selecting shaft,
a fine tuning shaft,
a variable capacitor,
an Oldham coupler which links rotation of said channel selecting shaft to a driving gear rotatably mounted on a lever-plate,
a driven gear engaging said driving gear and secured to a shaft of said variable capacitor,
a slippable click stop coupler which links turning of said lever plate, journaled rotatably around said variable capacitor shaft, to said driven gear, and
a memory means having a specified number of memory cams each comprising an eccentric ring the angular position of which is adjusted by said fine tuning shaft, said memory cams selectively touching a contacting part of said lever plate to give a memorized fine adjustment of said variable capacitor, said selection of said memory cams being made in response to the angular position of said channel selecting shaft.

2. A channel selector of claim 1 wherein in said memory means said memory cams are disposed around said channel selecting shaft.

3. A channel selector of claim 1 wherein said slippable counter comprises
a circular row of notches provided on a face of said driven gear,
engaging balls which are pressed against said notches by a spring means secured to said lever plate, said circular row of notches, balls and the spring means forming a click-stop slippable coupling for coupling said lever plate and said variable capacitor shaft.

4. A channel selector of claim 1 wherein in said memory means each memory cam includes a sleeve ring which is rotatably engaged about the outer face of said cam.

5. A channel selector of claim 1 wherein said Oldham coupler comprises a driving disc, an intermediate disc and a driven disc, each of said driving dics and driven disc comprising engaging detents along a diameter of each disc, said intermediate disc having indentations for slidably receiving said engaging detents on both faces thereof in a manner that on one face thereof said indentations are along a diameter of the intermediate disc and on the other face thereof said indentations are along a diameter which is at right angles to the first-mentioned diameter.

6. A channel selector comprising:
a driven gear secured to a variable capacitor shaft,
an Oldham coupler which transmits turning of a channel selection shaft to a driving gear engaging said driven gear,
a memory drum which comprises a specified number of memory cams, said drum being disposed on said channel selection shaft,
a Geneva gear means engaged to a gear means secured to said channel selection shaft and operatively related to said memory drum, for intermittently turning said memory drum, and
a lever-plate which is journaled rotatably about said variable capacitor shaft and which is coupled to said driven gear by a click-stop slippable coupler, said lever plate having a lever adapted to touch selected one of said memory cams.

7. A channel selector of claim 6, which further comprises:
a fine tuning shaft having a disengageable gear means which, when engaged, is operably joined to a gear means secured to said memory cams.

8. A channel selector comprising:
a channel selection shaft,
a fine tuning shaft,
a driven gear secured to a variable capacitor shaft,
an Oldham coupler which transmits turning of said channel selection shaft to a driving gear engaging said driven gear,
a memory drum which comprises a specified number of memory cams each of which comprises an eccentric ring the angular position of which is adjusted by said fine tuning shaft and is disposed on said channel selection shaft,
a Geneva gear means engaged to a gear means secured to said channel selection shaft and said memory drum, for turning said memory drum intermittently with respect to turning of said channel selection shaft,
a lever-plate which is journaled rotatably about said variable capacitor shaft and which is coupled to said driven gear by a click-stop slippable coupler, said lever-plate having a lever adapted to touch a selected one of said memory cams to give a memorized fine adjustment of said variable capacitor, and
a click-stop slippable coupler which couples said variable capacitor shaft to said lever-plate.

9. A channel selector of claim 8, which further comprises:
a disengageable gear means which, when engaged, links said turning shaft to adjust each gear secured to each of said memory cams.